United States Patent
Ingle

(10) Patent No.: US 9,553,133 B2
(45) Date of Patent: Jan. 24, 2017

(54) METHOD FOR PRODUCING AN OPTOELECTRONIC ASSEMBLY, AND OPTOELECTRONIC ASSEMBLY

(71) Applicant: OSRAM OLED GmbH, Regensburg (DE)

(72) Inventor: Andrew Ingle, Allershausen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/431,322

(22) PCT Filed: Sep. 26, 2013

(86) PCT No.: PCT/EP2013/070069
§ 371 (c)(1),
(2) Date: Mar. 26, 2015

(87) PCT Pub. No.: WO2014/049054
PCT Pub. Date: Apr. 3, 2014

(65) Prior Publication Data
US 2015/0372062 A1    Dec. 24, 2015

(30) Foreign Application Priority Data
Sep. 28, 2012 (DE) ............ 10 2012 109 218

(51) Int. Cl.
*H01L 27/32* (2006.01)
*H01L 51/52* (2006.01)
*H01L 51/56* (2006.01)

(52) U.S. Cl.
CPC ....... *H01L 27/3204* (2013.01); *H01L 51/5212* (2013.01); *H01L 51/56* (2013.01); *H01L 2227/323* (2013.01)

(58) Field of Classification Search
CPC ............ H01L 27/3204; H01L 2251/5361; H01L 27/3202; H01L 27/3288; H01L 51/0023
See application file for complete search history.

(56) References Cited

U.S. PATENT DOCUMENTS 7,012,585 B2 * 3/2006 Agostinelli ......... G09G 3/3216
345/76
2004/0021425 A1 * 2/2004 Foust .................. G09F 9/33
315/169.3
(Continued)

FOREIGN PATENT DOCUMENTS

CN    102683382 A    9/2012
DE    10324787 A1    2/2004
(Continued)

OTHER PUBLICATIONS

Korean Office Action based on Application No. 10-2015-7010921(7 Pages and 9 pages of English translation) dated Apr. 18, 2016 (Reference Purpose Only).
(Continued)

*Primary Examiner* — Jaehwan Oh
(74) *Attorney, Agent, or Firm* — Viering, Jentschura & Partner mbB

(57) ABSTRACT

A method for producing an optoelectronic assembly having a first and at least a second optoelectronic components may include forming a first electrically conductive layer on a substrate, forming a second electrically conductive layer on the first electrically conductive layer, applying an insulator material on the second electrically conductive layer and the substrate, such that at least a first insulator region, which insulates a first component region from a second component region, a second insulator region, which insulates the second component region from a first contact region, a third insulator region arranged on a side of the first component region, and a fourth insulator region arranged between the first and second insulator regions on a side of the second component (Continued)

region are formed by the insulator material, forming a first and second optically functional layers in the first and second component regions, respectively, and applying an electrically conductive electrode layer.

11 Claims, 5 Drawing Sheets

(56) References Cited

U.S. PATENT DOCUMENTS

| | | | |
|---|---|---|---|
| 2008/0171193 A1 | 7/2008 | Yi et al. | |
| 2011/0163337 A1* | 7/2011 | Shiang | H01L 27/3202 257/98 |
| 2012/0161174 A1* | 6/2012 | Yamazaki | H01L 27/3204 257/93 |
| 2012/0267147 A1* | 10/2012 | Ingle | H01L 51/0023 174/250 |
| 2013/0146859 A1 | 6/2013 | Hartmann et al. | |

FOREIGN PATENT DOCUMENTS

| | | |
|---|---|---|
| DE | 102009060066 A1 | 3/2011 |
| EP | 2500946 A2 | 9/2012 |
| JP | 2004031715 A | 1/2004 |
| JP | 2009123363 A | 6/2009 |
| JP | 2009224399 A | 10/2009 |
| JP | 2012151103 A | 8/2012 |
| KR | 20120059394 A | 6/2012 |
| WO | 2006104544 A1 | 10/2006 |
| WO | 2012025847 A1 | 3/2012 |
| WO | 2012096007 A1 | 7/2012 |

OTHER PUBLICATIONS

Korean Notice of Allowance based on application No. 10-2015-7010921 (2 pages and 1 page of English translation) dated Oct. 19, 2016 (Reference Purpose Only).

Chinese Office Action based on application No. 201380050998.X (8 pages and 8 pages of English translation) dated Sep. 26, 2016 (Reference Purpose Only).

International Search Report based on Application No. PCT/EP2013/070069(4 Pages and 3 pages of English translation) dated Jan. 31, 2014 (Reference Purpose Only).

* cited by examiner

METHOD FOR PRODUCING AN OPTOELECTRONIC ASSEMBLY, AND OPTOELECTRONIC ASSEMBLY

RELATED APPLICATIONS

The present application is a national stage entry according to 35 U.S.C. §371 of PCT application No.: PCT/EP2013/070069 filed on Sep. 26, 2013, which claims priority from German application No.: 10 2012 109 218.4 filed on Sep. 28, 2012, and is incorporated herein by reference in its entirety.

TECHNICAL FIELD

Various embodiments relate to a method for producing an optoelectronic assembly and to an optoelectronic assembly.

BACKGROUND

In optoelectronic components such as organic light-emitting diodes, insulators are used inter alia to separate two electrode regions from one another and/or electrically insulate them from one another.

Suitable insulators, for example photosensitive resists, are usually very expensive and difficult to apply, for example in a photolithographic process. For example, the resists are applied without a structure flat onto metal layers subsequently to be etched, and are exposed with the aid of a mask. Depending on the resist used, the exposed or unexposed regions can then be removed, so that the resist layer is structured. During the subsequent etching process, the remaining resist structures protect the underlying metal layer or the underlying metal layers.

SUMMARY

In various embodiments, a method for producing an optoelectronic assembly is provided, which simply and/or economically and/or without use of a photolithographic process makes it possible to produce an optoelectronic assembly, which includes a first electromagnetic radiation-emitting component and at least a second electromagnetic radiation-emitting component, which is connected in series with the first electromagnetic radiation-emitting component.

In various embodiments, an optoelectronic component is provided, which includes a first electromagnetic radiation-emitting component and at least a second electromagnetic radiation-emitting component, which is connected in series with the first electromagnetic radiation-emitting component, and which can be produced simply and/or economically and/or without use of a photolithographic process.

In various embodiments, a method for producing an optoelectronic assembly is provided. The optoelectronic assembly includes a first optoelectronic component and at least a second optoelectronic component. The first optoelectronic component is connected in series with the second optoelectronic component. In the method, a substrate is optionally prepared initially. A first electrically conductive layer is formed on the substrate. A second electrically conductive layer is formed on the first electrically conductive layer. An insulator material is applied in a structured way onto the second electrically conductive layer and the substrate, in such a way that: at least a first insulator region, which electrically insulates a first component region for arrangement of the first optoelectronic component from a second component region for arrangement of the second optoelectronic component, a second insulator region, which electrically insulates the second component region from a first contact region for contacting the optoelectronic assembly, a third insulator region, which is arranged on a side of the first component region facing away from the first insulator region, and a fourth insulator region, which is arranged between the first and second insulator regions on a side of the second component region facing away from the second insulator region, are formed by the insulator material. A third contact region is formed between the first insulator region and the fourth insulator region. A first optically functional layer is formed in the first component region and a second optically functional layer is formed in the second component region. An electrically conductive electrode layer is applied in a structured way onto the optically functional layers and the first and third contact regions, in such a way that the first optically functional layer is electrically coupled to the third contact region and the second optically functional layer is electrically coupled to the first contact region.

That the insulator material and/or the electrode layer and/or subsequently further layers or materials are "applied in a structured way" means in various embodiments that the desired structure is already formed during the application. The surface to be coated is therefore exposed only in subregions, which depend on the desired structure. This is in contrast to flat application of the corresponding layers and subsequent structuring of the layers, as is the case for example in a photolithographic method. Structured application of the layers makes it possible to be able to obviate initially flat application of the corresponding layers and subsequent elaborate structuring of the layers, for example the photolithographic method, and/or an expensive photoresist for the photolithographic method. This contributes to simple and/or economical production of the optoelectronic assembly having the electromagnetic radiation-emitting components connected in series.

The corresponding materials or layers may for example be applied in a structured way onto the substrate by printing, for example inkjet printing, or screen printing, by a doctor blade and/or by deposition with the aid of SAMs (self-assembling monolayers) and the like.

An optoelectronic component may, for example, be an electromagnetic radiation-absorbing or -emitting component. An electromagnetic radiation-absorbing component may, for example, be a solar cell. An electromagnetic radiation-emitting component may in various embodiments be an electromagnetic radiation-emitting semiconductor component and/or be configured as an electromagnetic radiation-emitting diode, as an organic electromagnetic radiation-emitting diode, as an electromagnetic radiation-emitting transistor or as an organic electromagnetic radiation-emitting transistor. The radiation may for example be light in the visible range, UV light and/or infrared light. In this context, the electromagnetic radiation-emitting component may, for example, be configured as a light-emitting diode (LED), as an organic light-emitting diode (OLED), as a light-emitting transistor or as an organic light-emitting transistor. The light-emitting component may in various embodiments be part of an integrated circuit. Furthermore, a multiplicity of light-emitting components may be provided, for example fitted in a common package.

The substrate may, for example, include or be a substrate layer. The substrate may, for example, be a transparent or nontransparent substrate. For example, the substrate may include glass, quartz, sapphire, one or more plastic films, one or more coated plastic films, metal, one or more metal films, one or more films which are coated with an electrically insulating layer, a silicon wafer or another suitable substrate material. A substrate may, for example, be understood as being the layer onto which all other layers are subsequently applied during production of the optoelectronic assembly. Such subsequent layers may, for example, be layers required for the radiation emission.

The first electrically conductive layer includes a first electrically conductive material, and the second electrically conductive layer includes a second electrically conductive material. The first and/or second electrically conductive materials are materials or substances having the capability of conducting electric current. The first electrically conductive material may, for example, be different to the second electrically conductive material. For example, the first electrically conductive material may be provided for first electrodes, for example for the anodes or cathodes, of the optoelectronic components.

The first electrically conductive layer may, for example, be deposited directly on the substrate layer. The first electrically conductive layer may, for example, be a transparent conductive layer. It may, without being restricted thereto, be formed from a transparent conductive oxide (TCO), for example indium-doped tin oxide (ITO) or ZnO, In/ZnO, SnZnO, Al—ZnO and the like. The first electrically conductive layer may for example be applied onto the substrate layer by sputtering, for example DC sputtering, physical vapor deposition (PVD) or the like.

The second electrically conductive layer may, for example, be deposited on the first electrically conductive layer. The second electrically conductive material may for example, without being restricted thereto, include one or more metals, for example aluminum, barium, indium, copper, silver, gold, magnesium, calcium and lithium and the like, as well as mixtures or combinations thereof, for example in the form of alloys with one another or with other metals. The second electrically conductive layer may for example be applied onto the first electrically conductive layer by evaporation, sputtering, for example DC sputtering, physical vapor deposition (PVD) or the like.

The electrically conductive layers may for example also respectively include sublayers, which may for example, as an alternative or in addition to the metals mentioned, also include chromium and molybdenum. Examples of possible layer sequences in an electrically conductive layer including one or more sublayers are Mo—Al—Mo, Cr—Al—Cr, Cr—Cu—Cr and Cr—Cu.

The insulator material refers to an insulating substance, which is applied in such a way that it prevents a flow of current between two electrically conductive regions, for example between the first electrically conductive layer or the second electrically conductive layer in the first component region and the first electrically conductive layer or second electrically conductive layer in the second component region. The insulator material may be a coat or a coating medium, for example a polymer and/or a resist. The resist may, for example, include a coating substance that can be applied in liquid or powder form.

The electrode layer may for example include or be formed from aluminum, barium, indium, silver, gold, magnesium, calcium and/or lithium as well as combinations thereof or a compound thereof, in particular an alloy, and/or transparent conductive oxides, for example metal oxides such as zinc oxide, tin oxide, cadmium oxide, titanium oxide, indium oxide or indium-doped tin oxide (ITO), aluminum-doped zinc oxide (AZO), $Zn_2SnO_4$, $CdSnO_3$, $MgIn_2O_4$, $GaInO_3$, $Zn_2In_2O_5$ or $In_4Sn_3O_{12}$ or mixtures of different transparent conductive oxides. The electrode layer may, for example, form cathodes or anodes of the optoelectronic component.

The optically functional layers may for example be radiation-emitting layers, such as fluorescent and/or phosphorescent emitter layers, for example those of electromagnetic radiation-emitting components, for example LEDs or OLEDs.

In various embodiments, a first trench and at least a second trench are formed in the first and second electrically conductive layers before the structured application of the insulator material, in such a way that the substrate is exposed in the first trench and the second trench. The first and second trenches are filled with the insulator material during the structured application of the insulator material, in such a way that the insulator material overlaps the edges of the first trench and the second trench. The first trench at least partially bounds the first insulator region and the second trench at least partially bounds the second insulator region. The trenches may, for example, be formed by laser ablation. Furthermore, the trenches may partially or fully extend around the first component region, or the second component region. Furthermore, further trenches may be formed and/or the trenches may be part of a two-dimensional trench structure extending in a plane.

In various embodiments, the second electrically conductive layer is removed in the first component region and the second component region before the application of the optically functional layers. The optically functional layers are applied onto the first layer after the removal of the second electrically conductive layer in the first and second component regions. The second electrically conductive layer may, for example, be removed by an etching method. The etching of the second electrically conductive material may, for example, be carried out in an etching bath in this case. The etching may, for example, include erosion of the second electrically conductive material on the surface of the first electrically conductive layer by the use of suitable etching substances. The etching substances may, for example, be chemical substances that can modify the material to be removed by a chemical reaction (usually oxidizing) and/or can bring it into solution. Examples of etchants are acids or strong oxidizing agents. Examples which may be mentioned are $HNO_3$, $HCl$, $H_3PO_4$, acetic acid, $H_2SO_4$, cerium ammonium nitrate (CAN) and $H_2O_2$. The etching bath may, for example, be selected in such a way that the first electrically conductive layer, for example an ITO layer, is not attacked or impaired by the etchant used.

In various embodiments, a protective layer is applied in a structured way onto the second electrically conductive layer after the structured application of the insulator material and before the removal of the second electrically conductive layer in the first and second component regions, in such a way that the contact regions are covered with the material of the protective layer. The protective layer covers the contact regions during the removal of the second electrically conductive layer, so that the second electrically conductive layer is preserved in the contact regions. The protective layer is removed after the removal of the second electrically conductive layer in the first, the second and/or the third component region. The protective layer may, for example, include a material or a substance which is used to protect the second electrically conductive material of the second electrically conductive layer in the subregions, on which it is applied on the second electrically conductive layer, in the further course of the method for producing the optoelectronic assembly, for example in one or more further process steps. The protective layer may for example be a coat, a resist or the like. For example, the protective layer may be an etch stop resist, for example an etch stop resist as used in the production of printed circuit boards (PCBs). This etch stop resist may be crosslinked or cured thermally or by UV radiation. The protective layer may, for example, be soluble in a solvent in which the insulator material is insoluble. For example, the protective layer may be alkaline-soluble or base-soluble. For example, the protective layer may be soluble in an alkaline solution, for example a weakly alkaline aqueous solution of salts (for example NaOH, KOH, $NH_4OH$, or quaternary ammonium salts such as $N(CH_3)_4OH$).

The structured application of the protective layer may take place both after the application of the second electrically conductive layer on the first electrically conductive layer and before the structured application of the insulator material on the second electrically conductive layer, and after the structured application of the insulator material on the second electrically conductive layer and before the application of the optically functional layers on the second electrically conductive layer. The structured application of the protective layer may in this case be carried out in such a way that the second electrically conductive layer is covered with the material of the protective layer in the contact regions, and is not covered with the material of the protective layer in the component regions. The protective material may be arranged—at least locally—over or on the insulator material.

For example, both the insulator material and the protective layer may be resistant to the chemicals used for etching the second electrically conductive material. In the regions, on which they are applied, of the second electrically conductive layer, insulator material and the protective layer may be used as an etch stop for the second electrically conductive layer or the second electrically conductive material in the corresponding regions. By etching of the second electrically conductive material, the structures, which lie below the insulator layer and/or the protective layer, of the second electrically conductive layer, and of the first electrically conductive layer are preserved. The etching process for removing the second electrical layer in the component regions may, for example, be the only etching process which is carried out for producing the optoelectronic assembly.

In various embodiments, the insulator material is heated before the application of the optically functional layers, in such a way that it is deformed and encapsulates edges and/or side surfaces of the second electrically conductive layer. After the removal of the second electrical layer in the component regions, edges and/or side surfaces of the second electrical layer are exposed adjacent to component regions. Because of the heating, the insulator material, which adjoins the component regions and was used as an etch stop during the etching method, flows over these exposed edges and/or side surfaces of the second electrically conductive layer and encapsulates them. During the subsequent application of the optically functional layers, these adjoin in the direction perpendicular to the substrate surface only the first electrically conductive layer, which may for example be used as an anode, and in the direction parallel to the substrate surface the insulator material, which encapsulates the corresponding edges or side surfaces of the second electrically conductive layer. The thermally deformed insulator material can therefore prevent direct physical contact between the optically functional layers and the second electrically conductive layer. This can contribute to protecting the optically functional layers from wear and/or corrosion. Furthermore, it can contribute to better optical resolution of the optoelectronic assembly.

In various embodiments, the electrode layer includes: a first electrode section, by which the first optically functional layer is electrically coupled to the third contact region, and a second electrode section, by which the second optically functional layer is electrically coupled to the first contact region. For example, the first electrode section may form a second electrode, for example a cathode or an anode, of the first optoelectronic component, and the second electrode section may form a second electrode, for example a cathode or an anode, of the second optoelectronic component. Furthermore, the connection to the third contact region may be formed with the aid of the first electrode section. In other words, the first electrode region may extend beyond the first component region in such a way that it is in physical contact with the third contact region. Furthermore, the connection of the first optoelectronic component to the first contact region may be formed with the aid of the second electrode section. In other words, the second electrode region may extend beyond the second component region in such a way that it is in physical contact with the first contact region.

In various embodiments, a first electrode of the first optoelectronic component is formed by the second electrically conductive layer in the second contact region and the first electrically conductive layer in physical contact therewith in the first component region, and a second electrode of the first optoelectronic component is formed by the first electrode section. The first optoelectronic component includes the first organically functional layer between the first and second electrodes of the first optoelectronic component. A first electrode of the second optoelectronic component is formed by the second electrically conductive layer in the third contact region and the first electrically conductive layer in physical contact therewith in the second component region, and a second electrode of the second optoelectronic component is formed by the second electrode section. The second optoelectronic component includes the second organically functional layer between the first and second electrodes of the second optoelectronic component. The first optoelectronic component and the second optoelectronic component are connected in series by the physical contact of the second electrode of the first optoelectronic component with the first electrode of the second optoelectronic component.

In various embodiments, the insulator material is applied in a structured way onto the second layer and the substrate, in such a way that at least: a fifth insulator region, which electrically insulates a third component region for formation of a third optoelectronic component from the first contact region, and a sixth insulator region, which is arranged on a side of the third component region facing away from the fifth insulator region, are formed by the insulator material. A fourth contact region is formed between the sixth insulator region and the second insulator region. The second insulator region electrically insulates the second component region from the third component region. A third optically functional layer is formed in the third component region. The electrode layer is applied in a structured way onto the optically functional layers and the fourth contact region, in such a way that the third optically functional layer is electrically coupled to the first contact region and the second optically functional layer is electrically coupled to the fourth contact region.

In various embodiments, at least one of the trenches is formed by laser ablation. This can contribute to simple and economical production of the optoelectronic assembly. For example, an etching process for etching the trenches can be obviated.

In various embodiments, the insulator material is applied by a printing method. This can straightforwardly contribute to the insulator material being applied in a structured way onto the second electrically conductive layer and the substrate. The printing method may, for example, and/or include inkjet printing or screen printing.

In various embodiments, the protective layer is applied by a printing method. This can contribute to the protective layer being applied in a structured way onto the second electrically conductive layer and the substrate. The printing method may, for example, and/or include inkjet printing or screen printing.

In various embodiments, the insulator material is acid-soluble or base-soluble. This can contribute to the insulator material being removed straightforwardly with an acid or base.

In various embodiments, the material of the protective layer is base-soluble and the insulator material is acid-soluble. As an alternative thereto, the material of the protective layer is acid-soluble and the insulator material is base-soluble. The effect of this is that the insulator material remains undamaged during the removal of the protective layer.

In various embodiments, an optoelectronic assembly includes a substrate, a first electrically conductive layer on the substrate, and a second electrically conductive layer on the first electrically conductive layer. An insulator material is applied in a structured way onto the second layer and the substrate, in such a way that: at least a first insulator region, which electrically insulates a first component region, in which the first optoelectronic component is arranged, from a second component region, in which the second optoelectronic component is arranged, a second insulator region, which electrically insulates the second component region from a first contact region, a third insulator region, which is arranged on a side of the first component region facing away from the first insulator region, and a fourth insulator region, which is arranged between the first and second insulator regions on a side of the second component region facing away from the second insulator region, are formed by the insulator material. A third contact region is formed between the first insulator region and the fourth insulator region. A first optically functional layer is formed in the first component region, and a second optically functional layer is formed in the second component region. An electrically conductive electrode layer is applied in a structured way onto the optically functional layers and the third contact region, in such a way that the first optically functional layer is electrically coupled to the third contact region by the electrode layer and the second optically functional layer is electrically coupled to the first contact region by the electrode layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
FIG. 1 shows a first state of an embodiment of an optoelectronic assembly during a production process for producing the optoelectronic assembly.

In the following detailed description, reference will be made to the appended drawings, which are part of this description and in which specific embodiments in which the invention may be implemented are shown for illustration. In this regard, direction terminology such as "up", "down", "forward", "backward", "front", "rear", etc. is used with reference to the orientation of the figure or figures being described. Since constituent parts of embodiments can be positioned in a number of different orientations, the direction terminology is used for illustration and is in no way restrictive. It is to be understood that other embodiments may be used and structural or logical modifications may be carried out, without departing from the protective scope of the present invention. It is to be understood that the features of the various embodiments described herein may be combined with one another, unless specifically indicated otherwise. The following detailed description is therefore not to be interpreted in a restrictive sense, and the protective scope of the present invention is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

An optoelectronic assembly may for example include two, three or more optoelectronic components. An optoelectronic component may, for example, include an electromagnetic radiation-absorbing component and/or an electromagnetic radiation-emitting component. An electromagnetic radiation-absorbing component may, for example, be a solar cell. An electromagnetic radiation-emitting component may in various embodiments be an electromagnetic radiation-emitting semiconductor component and/or be configured as an electromagnetic radiation-emitting diode, as an organic electromagnetic radiation-emitting diode, as an electromagnetic radiation-emitting transistor or as an organic electromagnetic radiation-emitting transistor. The electromagnetic radiation may for example be light in the visible range, UV light and/or infrared light. In this context, the electromagnetic radiation-emitting component may, for example, be configured as a light-emitting diode (LED), as an organic light-emitting diode (OLED), as a light-emitting transistor or as an organic light-emitting transistor. The light-emitting component may in various embodiments be part of an integrated circuit. Furthermore, a multiplicity of light-emitting components may be provided, for example fitted in a common package.

An embodiment of a method for producing an optoelectronic assembly, which includes a first optoelectronic component and a second optoelectronic component, which is connected in series with the first optoelectronic component, will be explained with the aid of FIGS. 1 to 10. In FIGS. 1 to 10, embodiments of constituent parts of the optoelectronic assembly are represented in different states of the optoelectronic assembly during the production method for producing the optoelectronic assembly.

FIG. 1 shows an embodiment of a substrate 10 of the optoelectronic assembly. The substrate 10 may for example include or be formed from glass, for example window glass, quartz, a semiconductor material and/or another suitable material, for example borosilicate, aluminum silicate and/or a standard material from the display industry. The substrate 10 may furthermore include or be formed from a plastic film or a laminate including one or more plastic films. The plastic may include or be formed from one or more polyolefins (for example polyethylene (PE) with high or low density or polypropylene (PP)). The plastic may furthermore include or be formed from polyvinyl chloride (PVC), polystyrene (PS), polyester and/or polycarbonate (PC), polyethylene terephthalate (PET), polyethersulfone (PES) and/or polyethylene naphthalate (PEN). The substrate 10 may include or be formed from a metal or a metal compound, for example copper, silver, gold, platinum or the like. The metal or a metal compound may also be formed as a metal film or a metal-coated film. The substrate 10 may include one or more of the materials mentioned above.

The substrate 10 may be configured to be translucent or even transparent.

In various embodiments, the term "translucent" or "translucent layer" may be understood as meaning that a layer is transmissive for electromagnetic radiation, for example for the radiation emitted by a electromagnetic radiation-emitting component, for example of one or more wavelength ranges, for example for light in a wavelength range of visible light (for example at least in a subrange of the wavelength range of from 380 nm to 780 nm). For example, in various embodiments, the term "translucent layer" is to be understood as meaning that essentially, the total amount of radiation input into a structure (for example a layer) is also output from the structure (for example layer), in which case a part of the light may be scattered.

In various embodiments, the term "transparent" or "transparent layer" may be understood as meaning that a layer is transmissive for light (for example at least in a subrange of the wavelength range of from 380 nm to 780 nm), electromagnetic radiation input into a structure (for example a layer) also being output from the structure (for example layer) essentially without scattering or wavelength conversion. In various embodiments, "transparent" is therefore to be regarded as a special case of "translucent". For the case in which, for example, an optoelectronic component which is monochromatic or limited in its emission spectrum is intended to be provided, it may be sufficient for the optically translucent layer structure to be translucent at least in a subrange of the wavelength range of the desired monochromatic electromagnetic radiation, or for the limited emission spectrum.

Figure 2:
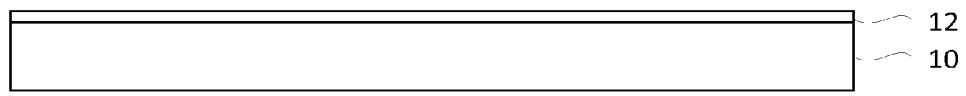
FIG. 2 shows a second state of the optoelectronic assembly during the production process for producing the optoelectronic assembly.

FIG. 2 shows the substrate 10 according to FIG. 1 and an embodiment of a first electrically conductive layer 12, which is formed on the substrate 10. Between the substrate 10 and the first electrically conductive layer 12, a barrier layer not shown in FIG. 2 and explained below with reference to FIG. 20 may for example be formed.

The first electrically conductive layer 12 may be, or may be formed from, a first electrically conductive material, for example a metal or a transparent conductive oxide (TCO), or a layer stack of a plurality of layers of the same metal or different metals and/or of the same TCO or different TCOs. Transparent conductive oxides may for example be transparent conductive substances, for example metal oxides, for example zinc oxide, tin oxide, cadmium oxide, titanium oxide, indium oxide or indium tin oxide (ITO), for example ZnO, IN/ZnO, SnZnO or AlZnO. Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of various transparent conductive oxides may also belong to the TCO group and may be used in various embodiments. Furthermore, the TCOs do not necessarily correspond to a stoichiometric composition, and may furthermore be p-doped or n-doped. In various embodiments, the first electrically conductive layer 12 may include a metal; for example Ag, Pt, Au, Mg, Al, Ba, In, Ag, Au, Mg, Ca, Sm or Li, as well as compounds, combinations or alloys of these substances. In various embodiments, the first electrically conductive may be formed from a layer stack of a combination of a layer of a metal on a layer of a TCO, or vice versa. One example is a silver layer, which is applied on an indium tin oxide layer (ITO) (Ag on ITO) or ITO/Ag/ITO multilayers. The first electrically conductive material of the first electrically conductive layer 12 may, for example, be selected in such a way that it can withstand an etching process, explained below, for removing a second electrically conductive material explained below.

In various embodiments, the first electrically conductive layer 12 may include one or more of the following substances as an alternative or in addition to the substances mentioned above: networks of metal nanowires and nanoparticles, for example of Ag; networks of carbon nanotubes; graphene particles and graphene layers; networks of semiconducting nanowires. Furthermore, the first electrically conductive layer may include electrically conductive polymers or transition metal oxides or transparent electrically conductive oxides.

In various embodiments, the first electrically conductive layer 12 and/or the substrate 10 may be configured to be translucent or transparent. In the case that the first electrically conductive layer includes or is formed from a metal, the first electrically conductive layer 12 may for example have a layer thickness less than or equal to approximately 25 nm, for example a layer thickness less than or equal to approximately 20 nm, for example a layer thickness less than or equal to approximately 18 nm. Furthermore, the electrically conductive layer 12 may for example have a layer thickness greater than or equal to approximately 10 nm, for example a layer thickness greater than or equal to approximately 15 nm. In various embodiments, the first electrically conductive layer 12 may have a layer thickness in a range of from approximately 10 nm to approximately 25 nm, for example a layer thickness in a range of from approximately 10 nm to approximately 18 nm, for example a layer thickness in a range of from approximately 15 nm to approximately 18 nm.

Furthermore, for the case in which the first electrically conductive layer 12 includes or is formed from a transparent conductive oxide (TCO), the first electrically conductive layer 12 may for example have a layer thickness in a range of from approximately 50 nm to approximately 500 nm, for example a layer thickness in a range of from approximately 75 nm to approximately 250 nm, for example a layer thickness in a range of from approximately 100 nm to approximately 150 nm.

Furthermore, for the case in which the first electrically conductive layer 12 is formed for example from a network of metal nanowires, for example of Ag, which may be combined with conductive polymers, a network of carbon nanotubes, which may be combined with conductive polymers, or of graphene layers and composites, the first electrically conductive layer 12 may for example have a layer thickness in a range of from approximately 1 nm to approximately 500 nm, for example a layer thickness in a range of from approximately 10 nm to approximately 400 nm, for example a layer thickness in a range of from approximately 40 nm to approximately 250 nm.

The first electrically conductive layer 12 may be configured in order to form anodes, i.e. hole-injecting electrodes, or cathodes, i.e. electron-injecting electrodes. The first electrically conductive layer 12 may for example be applied onto the substrate 10 by sputtering, for example DC sputtering, physical vapor deposition (PVD) or the like. The first electrically conductive layer 12 may for example be applied flat, i.e. without a structure, onto the substrate 10.

Figure 3:
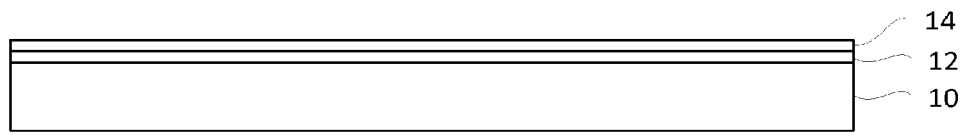
FIG. 3 shows a third state of the optoelectronic assembly during the production process for producing the optoelectronic assembly.

FIG. 3 shows the substrate 10, the first electrically conductive layer 12 and an embodiment of a second electrically conductive layer 14, which is formed on the first electrically conductive layer 12. The second electrically conductive layer 14 may for example include chromium, aluminum, molybdenum, copper or silver. For example, the second electrically conductive layer 14 may include sublayers that include different metals in alternation. For example, the second electrically conductive layer 12 may be formed from a stack of Cr—Al—Cr, Mo—Al—Mo, Cr—Cu—Cr. For example, the second electrically conductive layer 14 may have a layer thickness of for example between 600 and 900 nm, for example between 700 and 800 nm. The sublayers may optionally have thicknesses of for example between 50 and 500 nm, for example between 100 and 400 nm. The second electrically conductive layer 14 may for example be applied onto the first electrically conductive layer 12 by sputtering, for example DC sputtering, physical vapor deposition (PVD) or the like. The second electrically conductive layer 14 may for example be applied flat, i.e. without a structure, onto the first electrically conductive layer 12.

Figure 4:
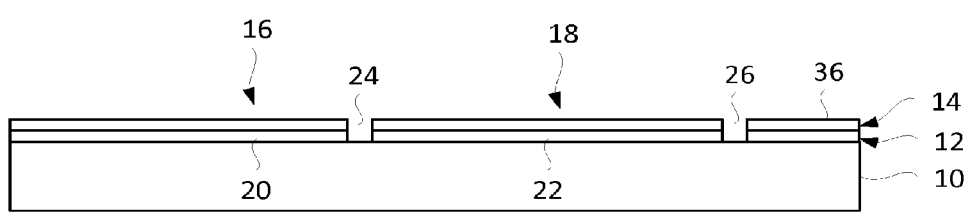
FIG. 4 shows a fourth state of the optoelectronic assembly during the production process for producing the optoelectronic assembly.

FIG. 4 shows the substrate 10 and the first and second electrically conductive layers 12, 14, embodiments of a first trench 24 and a second trench 26 being formed in the two electrically conductive layers 12, 14. The two trenches 24, 26 may, for example, be formed by laser ablation. The material of the substrate 10 is exposed in the trenches 24, 26. In other words, a depth of the trenches 24, 26 corresponds to a total thickness of the two electrically conductive layers 12, 14. For the laser ablation, a laser operated in continuous-wave or pulsed mode may for example be used, for example a femto-, nano- or pico-laser. The laser may for example emit electromagnetic radiation in the IR range or in the UV range, for example at 200 to 300 nm, and/or with a power of from 0.5 W to 1 W.

The first trench 24 separates a first component region 16 from a second component region 18. The second trench 24 separates the second component region 16 from a first contact region 36. The first and/or second trenches 24, 26 may be part of a trench structure, which, for example, partially or fully bounds the first and/or second component regions 16, 18 in the planes of the two electrically conductive layers 12, 14. A first optoelectronic component is subsequently formed in the first component region 16, and a second optoelectronic component is subsequently formed in the second component region 18. In this context, the first electrically conductive layer 12 forms a first electrode 20 of the first optoelectronic component in the first component region 16 and a first electrode 22 of the second optoelectronic component 18 in the second component region 18. The first contact region 36 may, for example, be used for electrical contacting of the optoelectronic assembly.

Figure 5:
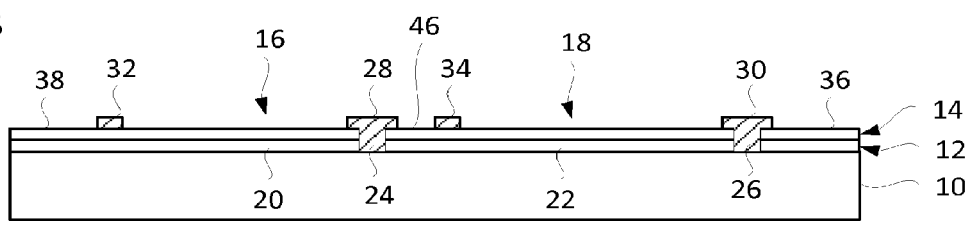
FIG. 5 shows a fifth state of the optoelectronic assembly during the production process for producing the optoelectronic assembly.

FIG. 5 shows the substrate 10 and the first and second electrically conductive layers 12, 14, an embodiment of an insulator material being applied in a structured way onto the second electrically conductive layer 14 and onto the substrate 10 in the trenches 24, 26. The insulator material may for example be applied in a structured way, in such a way that a first insulator region 28, a second insulator region 30, a third insulator region 32 and a fourth insulator region 34 are formed by it.

The first insulator region 28 electrically insulates the first component region 16 from the second component region 18. The second insulator region 30 electrically insulates the second component region 18 from the first contact region 36. The third insulator region 32 is arranged on a side of the first component region 16 facing away from the first insulator region 28. The fourth insulator region 34 is arranged between the first and second insulator regions 28, 30 on a side of the second component region 18 facing away from the second insulator region 30. A third contact region 46 is formed between the first insulator region 28 and the fourth insulator region 34. The second contact region 38 can be used for electrical contacting of the optoelectronic assembly. The third contact region 46 can be used for serial contacting of the first optoelectronic component with the second optoelectronic component. In other words, the first optoelectronic component and the second optoelectronic component can be connected in series via the third contact region 46.

For example, the third contact region 46 is physically coupled directly to the first electrode 22 of the second optoelectronic component.

During the structured application of the insulator material, the first and second trenches 24 are filled with the insulator material in such a way that the insulator material overlaps the edges of the first and second trenches 24 and lies on the second electrical conductive layer 14. The first trench 24 in this case at least partially bounds the first insulator region 28 and the second trench 26 at least partially bounds the second insulator region 30.

The insulator material may, for example, be an electrically insulating substance which prevents a direct flow of current between the first or second electrically conductive layer 12, 14 in the first component region 16 and the first or second electrically conductive layer 12, 14 in the second component region 18. For example, the insulator material prevents direct flow of current from the first electrode 20 of the first optoelectronic component to the first electrode 22 of the second optoelectronic component.

The insulator material may for example include or be formed from a coat or a coating medium, for example a polymer and/or a resist. The resist may, for example, include a coating substance that can be applied in liquid or powder form. That the insulator material is applied in a structured way means that the desired structure is already formed during application of the insulator material. The surface to be coated is therefore coated only in subregions, which depend on the desired structure. The insulator material may for example be applied in a structured way by a printing method, for example by screen printing, inkjet printing or flexographic printing, or doctor blading.

The insulator material may, for example, be selected in such a way that it can be softened by a subsequent treatment and/or can be applied in a flowable state. In addition to the electrical insulation, the insulator material may be used as an etch stop in an etching process, to be explained in more detail below, for removing the second electrically conductive layer 14 from the component regions 16, 18. The insulator material may, for example, be acid-soluble and not base-soluble. For example, the insulator material may be soluble in chloroform and/or a chloro-organic compound or a benzine-like compound, for example in hexyne or heptane. As an alternative thereto, the insulator material may be base-soluble and not acid-soluble.

Figure 6:
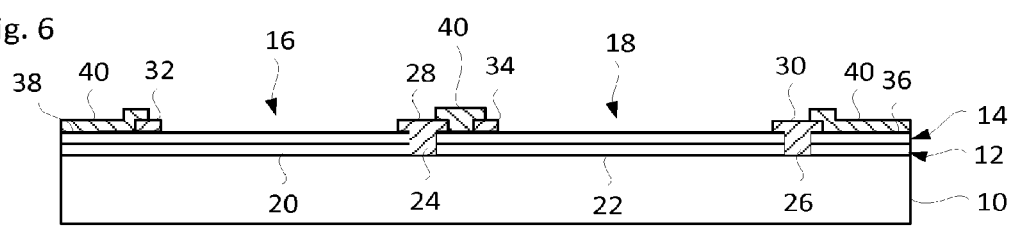
FIG. 6 shows a sixth state of the optoelectronic assembly during the production process for producing the optoelectronic assembly.

FIG. 6 shows the substrate 10 and the first and second electrically conductive layers 12, 14 with the insulator material, an embodiment of a protective layer 40 being applied in a structured way onto the first, second and third contact regions 36, 38, 46. Adjacent to the first, second and third contact regions 36, 38, 46, the protective layer 40 partially overlaps the insulator regions 28, 30, 32, 34. The protective layer is used as an etch stop to protect the second electrically conductive layer in the contact regions 36, 38, 46 during a subsequent etching process for removing the second electrically conductive layer 14 in the component regions 16, 18.

That the protective layer 40 is applied in a structured way means that the desired structure is already formed during the application of the protective layer. The surface to be coated is therefore coated only in subregions, which depend on the desired structure. The protective layer 40 may for example be applied in a structured way by a printing method, for example by screen printing, inkjet printing or flexographic printing, or doctor blading. The material of the protective layer 40 may, for example, be base-soluble and not acid-soluble, for example when the insulator material is acid-soluble. For example, the material of the protective layer 40 may be soluble in sodium hydroxide, calcium hydroxide or tetramethylammonium hydroxide. As an alternative thereto, the material of the protective layer 40 may be acid-soluble and/not base-soluble, for example when the insulator material is base-soluble. The material of the protective layer 40 may, for example, include or be formed from a resist.

Figure 7:
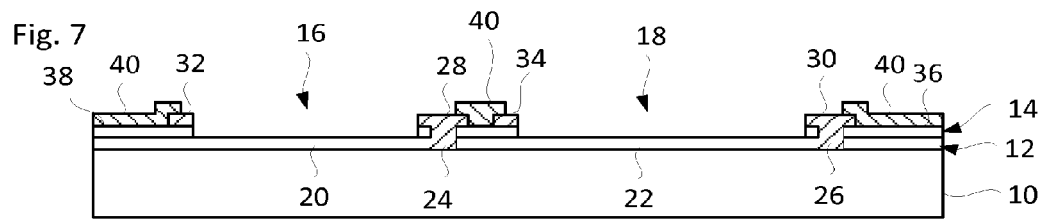
FIG. 7 shows a seventh state of the optoelectronic assembly during the production process for producing the optoelectronic assembly.

FIG. 7 shows the substrate 10 and the first and second electrically conductive layers 12, 14 with the insulator material and the protective layer 40, the second electrically conductive layer 14 being removed in the component regions 16, 18. The second electrically conductive layer 14 may, for example, be removed by an etching process. An etching bath may for example be used for the etching of the second electrically conductive layer 14, for example 3% strength trichloroacetic acid in water.

Adjacent to the first and second component regions 16, 18, at least one web of the second electrically conductive layer 14 is respectively preserved under a part of the first and second insulator regions 28, 30. These webs of the second electrically conductive layer 14 can contribute during operation of the optoelectronic component to good current distribution within the optoelectronic components.

Figure 8:
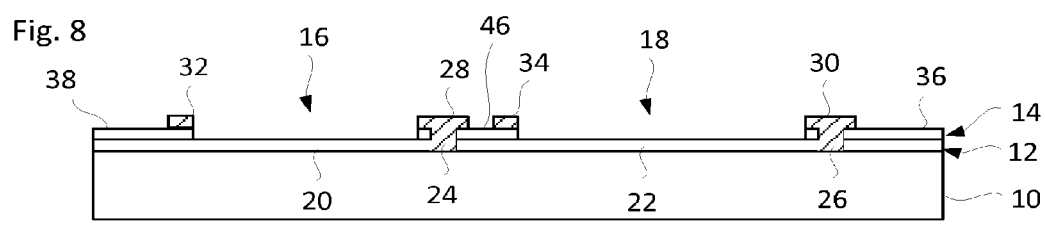
FIG. 8 shows an eighth state of the optoelectronic assembly during the production process for producing the optoelectronic assembly.

FIG. 8 shows the substrate 10 and the first and second electrically conductive layers 12, 14 with the insulator material, the protective layer 40 being removed. The protective layer 40 may, for example, be removed by a suitable base and/or a basic solvent. The contact regions 36, 38, 46 are exposed by the removal of the protective layer 40.

Figure 9:
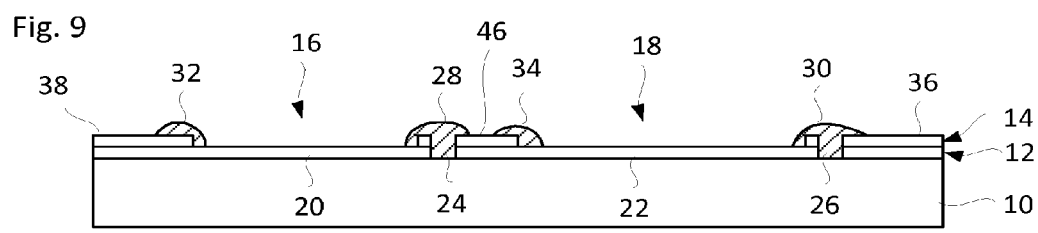
FIG. 9 shows a ninth state of the optoelectronic assembly during the production process for producing the optoelectronic assembly.

FIG. 9 shows the substrate 10 and the first and second electrically conductive layers 12, 14 with the insulator material, the structure of the insulator material being rounded so that the insulator material covers, and thus encapsulates, the free side surfaces and/or edges of the first and second electrically conductive layers 12, 14. The structure of the insulator material may, for example, be rounded by heating the insulator material to such an extent that it becomes liquid or at least viscous and flows over the exposed side surfaces or edges of the first and second electrically conductive layers 12, 14. The insulator material may, for example, be heated by heating the entire arrangement with the insulator material on the electrically conductive layers 12, 14 and the substrate 10, for example in an oven, for example a reflow oven.

Figure 10:
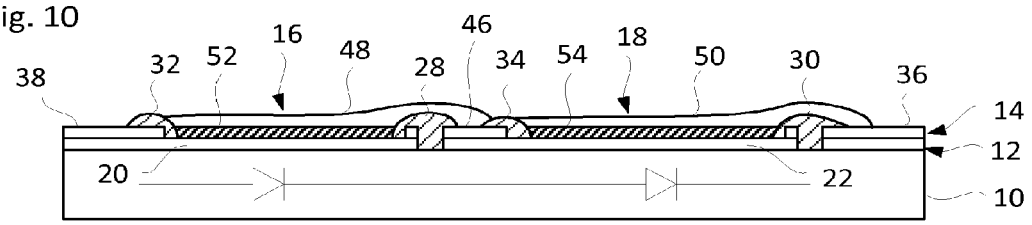
FIG. 10 shows an embodiment of the optoelectronic assembly.

FIG. 10 shows the optoelectronic assembly, which includes the substrate 10 and the first and second electrically conductive layers 12, 14 with the insulator material, a first organically functional layer 52 being formed in the first component region 16 and a second organically functional layer 52 being formed in the second component region 18.

The organically functional layers 52, 54 may, for example, constitute the optically active regions of the optoelectronic components, for example of OLEDs. The organically functional layers 52, 54 may for example be formed in one, two or more process steps. For example, the organically functional layers 52, 54 may be evaporated on in a vacuum. In the case of an OLED as an optoelectronic component, the organically functional layers 52, 54 may, for example, include semiconducting light-emitting organic layers. An embodiment of an OLED and the detailed configuration of the layer structure of the OLED are explained in more detail below with reference to FIG. 20.

An electrode layer is applied in a structured way onto the organically functional layers 52, 54. The electrode layer is, for example, applied in a structured way in such a way that a first electrode section 48 is formed on the first organically functional layer 52, the first insulator region 28 and the third contact region 46, and a second electrode section 50 is formed on the second organically functional layer 54, the second insulator region 30 and the first contact region 36.

The first electrode section 48 electrically contacts the first organically functional layer 52 and the third contact region 46. The first electrode section 48 is used as a second electrode, for example as a cathode, for the first optoelectronic component. The second electrode section 50 electrically contacts the second organically functional layer 54 and the first contact region 36. The second electrode section 50 is used as the second electrode, for example as a cathode, for the second optoelectronic component.

The first optoelectronic component may on the one hand be electrically contacted via the second contact region 38, and may on the other hand be connected in series with the second optoelectronic component via the first electrode section 48 and the third contact region 46. The second optoelectronic component may on the one hand be connected in series with the first optoelectronic component via the third contact region 46, and may on the other hand be electrically contacted via the second electrode section 50 and the first contact region 36.

In FIG. 10, two diode symbols on the substrate 10 symbolize the series connection of the two optoelectronic components.

Figure 11:
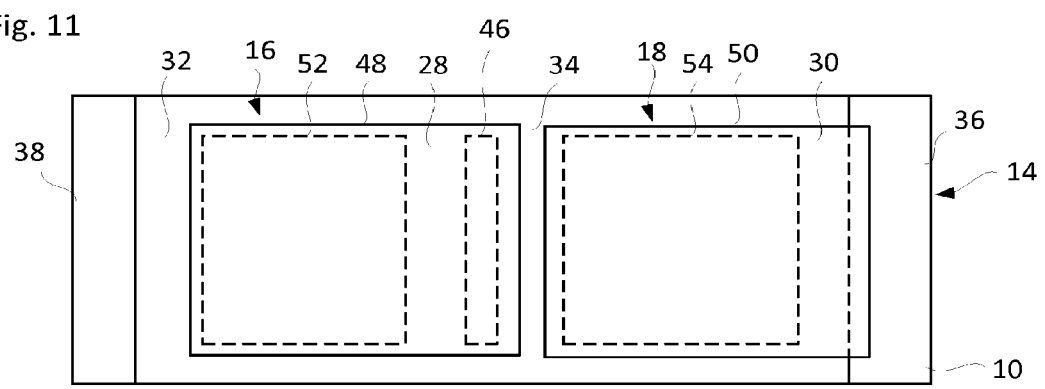
FIG. 11 shows a plan view of the optoelectronic assembly according to FIG. 10.

FIG. 11 shows a plan view of the optoelectronic assembly according to FIG. 10. From FIG. 11, it can be seen that the organically functional layers 52, 54, the first and third contact regions 36, 46 and/or the electrode sections 48, 50 are, for example, configured as a rectangle. As an alternative thereto, the organically functional layers 52, 54, the first and third contact regions 36, 46 and/or the electrode sections 48, 50 may, for example, be configured as a square or as a circle. The trench structure (not represented in FIG. 11), which also includes the two trenches 24, 26, may be configured correspondingly.

An embodiment of a method for producing an optoelectronic assembly that additionally includes a third optoelectronic component, which is connected in series with the first and second optoelectronic components, will be explained with the aid of FIGS. 12 to 19. In FIGS. 12 to 19, embodiments of constituent parts of the optoelectronic assembly are represented here in different states of the optoelectronic assembly during the production method for producing the optoelectronic assembly. The method steps may, for example, in principle be the same as in the method explained above, although in contrast thereto three optoelectronic components connected in series are formed. In what follows, therefore, only the formation of the constituent parts of the optoelectronic assembly which are new in comparison with the method explained above will be discussed.

Figure 12:
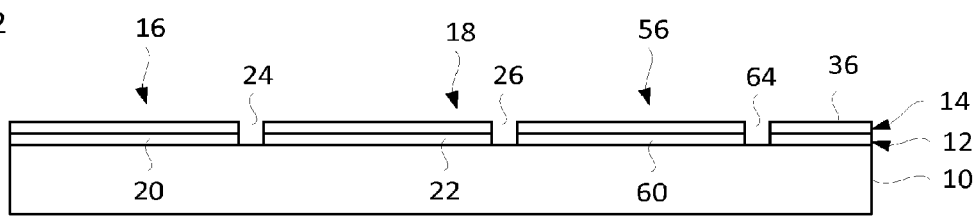
FIG. 12 shows a first state of an embodiment of an optoelectronic assembly during the production process for producing the optoelectronic assembly.

FIG. 12 shows the substrate 10 with the two electrically conductive layers 12, 14 and the two trenches 24, 26, as explained in more detail for example with reference to FIG. 4, a third trench 64 additionally being formed for example in the electrically conductive layers 12, 14. The substrate 10 is exposed in the third trench 64. In other words, a depth of the third trench 64 corresponds to a total thickness of the two electrically conductive layers 12, 14. The second and third trenches 26, 64 bound a third component region 56. The third trench 64 separates the third component region 56 from the first contact region 36. The third trench 64 may, for example, be formed in a way corresponding to the first and/or second trench 24, 26. The third trench 64 may, for example, be formed by laser ablation. The third trench 64 may be part of the trench structure which, for example, partially or fully bounds the first, second and/or third component regions 16, 18, 56 in the planes of the two electrically conductive layers 12, 14. A third optoelectronic component is subsequently formed in the third component region 56. In this context, the first electrically conductive layer 12 forms a first electrode 60, for example an anode, of the first optoelectronic component in the third component region 56.

Figure 13:
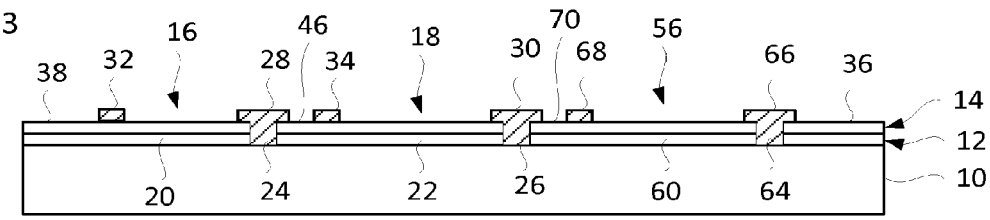
FIG. 13 shows a second state of the optoelectronic assembly according to FIG. 12 during the production process for producing the optoelectronic assembly.

FIG. 13 shows the substrate 10 with the two electrically conductive layers 12, 14, as explained in more detail for example with reference to FIG. 5, although in contrast thereto the insulator material is for example applied in a structured way onto the second electrically conductive layer 14 and onto the substrate 10 in the third trench 64, in such a way that a fifth insulator region 66 and a sixth insulator region 68 are formed by it.

The fifth insulator region 66 electrically insulates the third component region 56 from the first contact region 36. The sixth insulator region 68 is arranged between the second and fifth insulator regions 30, 66 on a side of the third component region 56 facing away from the fifth insulator region 66. A fourth contact region 70 is formed between the second insulator region 30 and the sixth insulator region 68. The fourth contact region 70 may be used for serial contacting of the second optoelectronic component with the third optoelectronic component. In other words, the second optoelectronic component and the third optoelectronic component may be connected in series via the fourth contact region 70. For example, the fourth contact region 70 is physically coupled directly to the first electrode 60 of the third optoelectronic component.

During the structured application of the insulator material, the third trench 64 is filled with the insulator material in such a way that the insulator material overlaps the edges of the third trench 64 and lies on the second electrical conductive layer 14. The third trench 64 in this case at least partially bounds the fifth insulator region 66.

The insulator material may, for example, prevent direct flow of current between the first or second electrically conductive layer 12, 14 in the second component region 18 and the first or second electrically conductive layer 12, 14 in the third component region 56. For example, the insulator material prevents direct flow of current from the first electrode 22 of the second optoelectronic component to the first electrode 60 of the third optoelectronic component.

Figure 14:
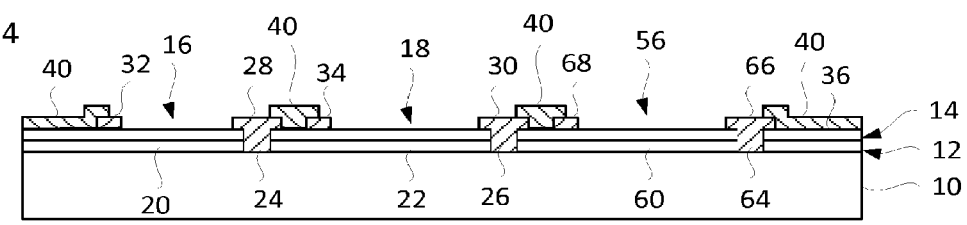
FIG. 14 shows a third state of the optoelectronic assembly according to FIG. 13 during the production process for producing the optoelectronic assembly.

FIG. 14 shows the substrate 10 and the first and second electrically conductive layers 12, 14 with the insulator material, an embodiment of a protective layer 40 being applied in a structured way onto the fourth contact region 70, for example as explained in more detail with reference to FIG. 6. Adjacent to the fourth contact region 70, the protective layer 40 overlaps the second and sixth insulator regions 30, 68.

Figure 15:
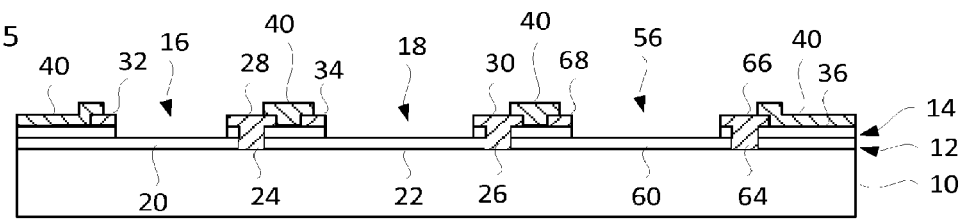
FIG. 15 shows a fourth state of the optoelectronic assembly according to FIG. 14 during the production process for producing the optoelectronic assembly.

FIG. 15 shows the substrate 10 and the first and second electrically conductive layers 12, 14 with the insulator material and the protective layer 40, the second electrically conductive layer 14 being removed in the component regions 16, 18, 56, for example as explained in more detail with reference to FIG. 7. The second electrically conductive layer 14 may, for example, be removed by an etching process.

Figure 16:
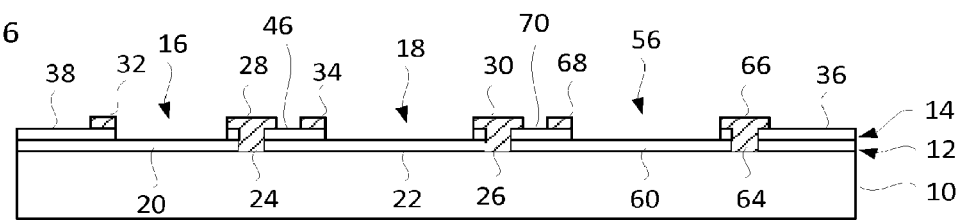
FIG. 16 shows a fifth state of the optoelectronic assembly according to FIG. 15 during the production process for producing the optoelectronic assembly.

FIG. 16 shows the substrate 10 and the first and second electrically conductive layers 12, 14 with the insulator material, the protective layer 40 being removed, for example as explained in more detail with reference to FIG. 8. The protective layer 40 may, for example, be removed by a suitable base and/or a basic solvent. The contact regions 36, 38, 46, 70 are exposed by the removal of the protective layer 40.

Figure 17:
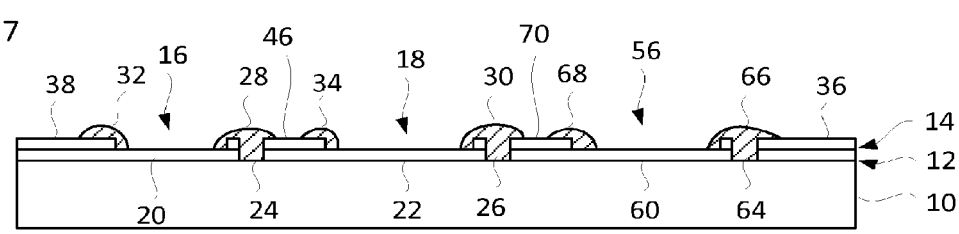
FIG. 17 shows a sixth state of the optoelectronic assembly according to FIG. 16 during the production process for producing the optoelectronic assembly.

FIG. 17 shows the substrate 10 and the first and second electrically conductive layers 12, 14 with the insulator material, the structure of the insulator material being rounded so that the insulator material covers, and thus encapsulates, the free side surfaces and/or edges of the first and second electrically conductive layers 12, 14, for example as explained in more detail with reference to FIG. 9.

Figure 18:
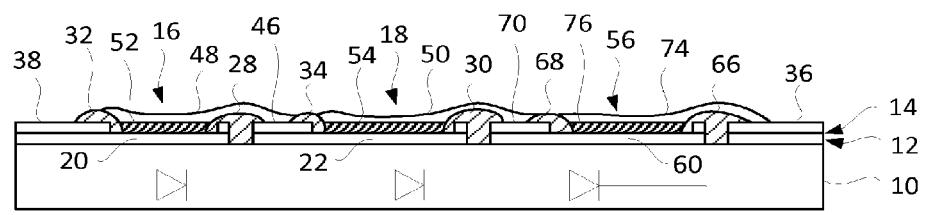
FIG. 18 shows the embodiment of the optoelectronic assembly according to FIG. 17.

FIG. 18 shows the optoelectronic assembly, which includes the substrate 10 and the first and second electrically conductive layers 12, 14 with the insulator material, a third organically functional layer 76 being formed in the third component region 56. An electrode layer is applied in a structured way onto the organically functional layers 52, 54, 76. The electrode layer is, for example, applied in a structured way in such a way that a third electrode section 74 is formed on the third organically functional layer 76, the fifth insulator region 66 and the first contact region 36. The third electrode section 74 electrically contacts the third organically functional layer 76 and the first contact region 36. The third electrode section 74 is used as a second electrode, for example as a cathode, for the third optoelectronic component. The third optoelectronic component may on the one hand be connected in series with the second optoelectronic component via the fourth contact region 70, and may on the other hand be electrically contacted via the third electrode section 74 and the first contact region 36. The first, second and third optoelectronic components are therefore connected in series.

In FIG. 18, three diode symbols on the substrate 10 symbolize the series connection of the optoelectronic components.

Figure 19:
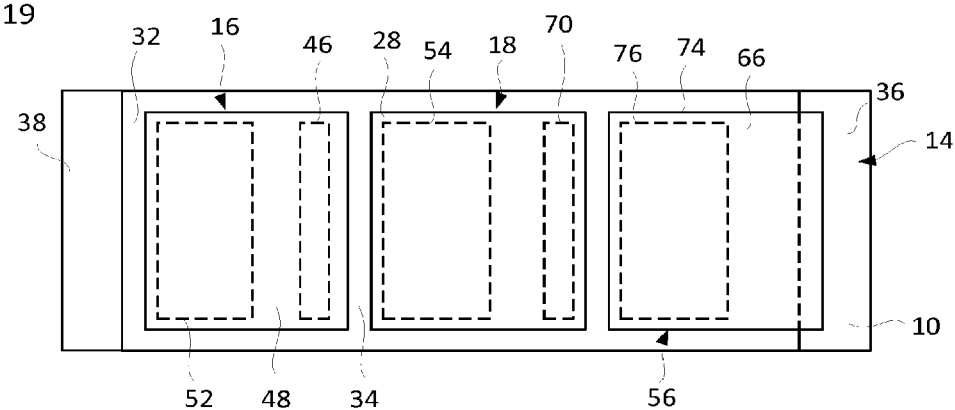
FIG. 19 shows a plan view of the optoelectronic assembly according to FIG. 18.

FIG. 19 shows a plan view of the optoelectronic assembly according to FIG. 18. From FIG. 19, it can be seen that the third organically functional layers 76, the fourth contact region 70 and/or the third electrode section 74 are, for example, configured as a rectangle. The trench structure (not represented in FIG. 18), which also includes the third trench 64, may be configured correspondingly.

Figure 20:
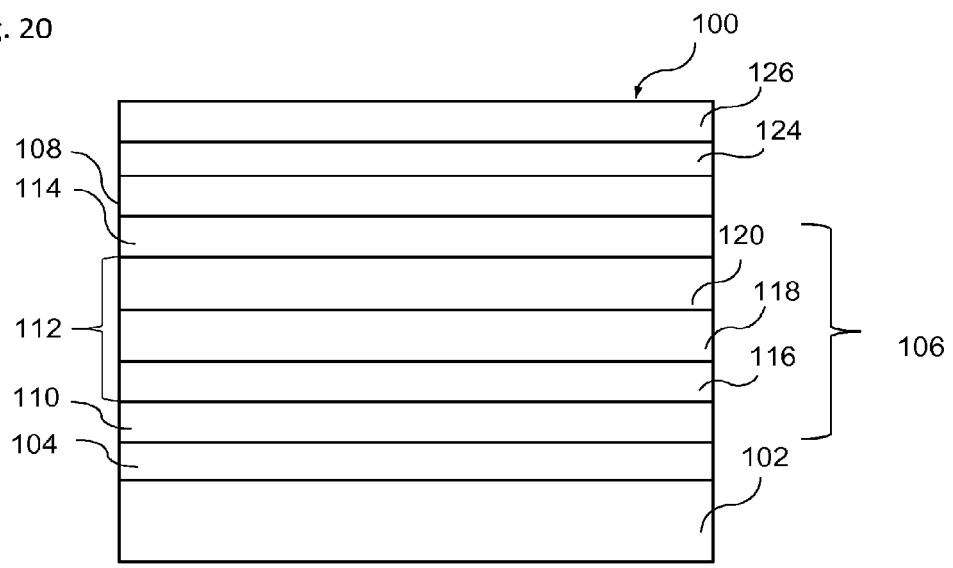
FIG. 20 shows an embodiment of a layer structure of an optoelectronic component.

FIG. 20 shows a schematic cross-sectional view of a layer structure of an embodiment of an optoelectronic component, according to various embodiments. The above-explained optoelectronic components of the optoelectronic assembly may, for example, be configured according to the layer structure explained below.

The optoelectronic component may for example be an electromagnetic radiation-emitting component, for example a light-emitting component 100, for example in the form of an organic light-emitting diode. The optoelectronic component may include a carrier 102. The carrier 102 may for example represent a subsection of the substrate 10, and may be used as a carrier element for electronic elements or layers, for example light-emitting elements.

In various embodiments, the organic light-emitting diode (or the electromagnetic radiation-emitting component 100 according to the embodiments described above or below) may be configured as a so-called top and bottom emitter. A top and/or bottom emitter may also be referred to as an optically transparent component, for example a transparent organic light-emitting diode.

In various embodiments, a barrier layer 104 may optionally be arranged on or over the carrier 102. The barrier layer 104 may, for example, also be regarded as a sublayer of the carrier 102. The barrier layer 104 may include or consist of one or more of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of from approximately 0.1 nm (one atomic layer) to approximately 5000 nm, for example a layer thickness in a range of from approximately 10 nm to approximately 200 nm, for example a layer thickness of approximately 40 nm.

An electrically active region 106 of the light-emitting component 100 may be arranged on or over the barrier layer 104. The electrically active region 106 may be understood as the region of the light-emitting component 100 in which an electric current flows in order to operate the light-emitting component 100. In various embodiments, the electrically active region 106 may include a first electrode 110, a second electrode 114 and an organic functional layer structure 112, as explained in more detail below. The first electrode 110 may for example represent one of the first electrodes 20, 22, 60, and/or the second electrode 114 may for example represent one of the electrode sections 48, 50, 74.

Thus, in various embodiments, the first electrode 110 may be applied (for example as part of the first electrically conductive layer 12) on or over the barrier layer 104 (or, if the barrier layer 104 is absent, on or over the carrier 102).

Furthermore, the electrically active region 106 of the light-emitting component 100 may include an organic functional layer structure 112, which is applied or formed on or over the first electrode 110. For example, the organically functional layer structure 112 may represent one, two or more of the organically functional layers 52, 54, 76.

The organic functional layer structure 112 may include one or more emitter layers 118, for example including fluorescent and/or phosphorescent emitters, as well as one or more hole conduction layers 116 (also referred to as hole transport layer or layers 120). In various embodiments, as an alternative or in addition, one or more electron conduction layers 116 (also referred to as electron transport layer or layers 116) may be provided.

Examples of emitter materials which may be used in the light-emitting component 100 according to various embodiments for the emitter layer or layers 118 include organic or organometallic compounds, such as derivatives of polyfluorene, polythiophene and polyphenylene (for example 2- or 2,5-substituted poly-p-phenylene vinylene) and metal complexes, for example iridium complexes, for example blue phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridine) iridium III), red phosphorescent Ru(dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9, 10-bis[N,N-di-(p-tolyl)-amino]anthracene) and red fluorescent DCM2 (4-dicyanomethylene)-2-methyl-6-julolidyl-9-enyl-4H-pyrane) as nonpolymeric emitters.

Such nonpolymeric emitters may, for example, be deposited by thermal evaporation. Furthermore, polymeric emitters may be used, which may in particular be deposited by a wet chemical method, for example a spin coating method.

The emitter materials may be embedded in a suitable way in a matrix material.

It should be pointed out that other suitable emitter materials are likewise provided in other embodiments.

The emitter materials of the emitter layer or layers 118 of the light-emitting component 100 may, for example, be selected in such a way that the light-emitting component 100 emits white light. The emitter layer or layers 118 may include a plurality of emitter materials emitting different colors (for example blue and yellow or blue, green and red); as an alternative, the emitter layer or layers 118 may also be constructed from a plurality of sublayers, for example a blue fluorescent emitter layer 118 or blue phosphorescent emitter layer 118, a green phosphorescent emitter layer 118 and a red phosphorescent emitter layer 118. Mixing of the different colors can lead to the emission of light with a white color impression. As an alternative, a converter material may also be arranged in the beam path of the primary emission generated by these layers, which material at least partially absorbs the primary radiation and emits secondary radiation with a different wavelength, so that a white color impression is obtained from (not yet white) primary radiation by the combination of primary radiation and secondary radiation.

The organic functional layer structure 112 may in general include one or more electroluminescent layers. The one or more electroluminescent layers may include organic polymers, organic oligomers, organic monomers, nonpolymeric organic small molecules, or a combination of these materials. For example, the organic functional layer structure 112 may include one or more electroluminescent layers which is or are configured as a hole transport layer 120, so that, for example in the case of an OLED, effective hole injection into an electroluminescent layer or an electroluminescent region is made possible. As an alternative, in various embodiments, the organic functional layer structure 112 may include one or more functional layers which is or are configured as an electron transport layer 116, so that, for example in the case of an OLED, effective electron injection into an electroluminescent layer or an electroluminescent region is made possible. For example, tertiary amines, carbazol derivatives, conductive polyaniline or polythylene dioxythiophene may be used as a material for the hole transport layer 120. In various embodiments, the one or more electroluminescent layers may be configured as an electroluminescent layer.

In various embodiments, the hole transport layer 120 may be applied, for example deposited, on or over the first electrode 110, and the emitter layer 118 may be applied, for example deposited, on or over the hole transport layer 120. In various embodiments, the electron transport layer 116 may be applied, for example deposited, on or over the emitter layer 118.

In various embodiments, the organic functional layer structure 112 (i.e. for example the sum of the thicknesses of hole transport layer or layers 120 and emitter layer or layers 118 and electron transport layer or layers 116) may have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm.

In various embodiments, the organic functional layer structure 112 may for example include a stack of a plurality of organic light-emitting diodes (OLEDs) that are arranged directly above one another, in which case each OLED may for example have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic functional layer structure 112 may for example include a stack of two, three or four OLEDs that are arranged directly above one another, in which case, for example, the organic functional layer structure 112 may have a layer thickness of at most approximately 3 µm.

The light-emitting component 100 may in general optionally include further organic functional layers, for example arranged on or over the one or more emitter layers 118 or on or over the electron transport layer or layers 116, which are used to further improve the functionality and therefore the efficiency of the light-emitting component 100.

The second electrode 114 may be applied (for example as part of the second electrode layer, for example as one of the electrode sections 48, 50, 74) on or over the organic functional layer structure 112 or optionally on or over the one or the plurality of further organic functional layer structures. In various embodiments, the second electrode 114 may include or be formed from the same substances as the first electrode 110, metals being particularly suitable in various embodiments. In various embodiments, the first electrode 110 and the second electrode 114 are both configured to be translucent or transparent. The light-emitting component 100 represented in FIG. 1 can therefore be configured as a top and bottom emitter (expressed another way, as a transparent light-emitting component 100). The second electrode 114 may be configured as an anode, i.e. as a hole-injecting electrode, or as a cathode, i.e. as an electron-injecting electrode.

Encapsulation 108, for example in the form of a barrier thin film/thin-film encapsulation 108, may optionally also be formed on or over the second electrode 114, for example on the electrode sections 48, 50, 74, and therefore on or over the electrically active region 106. In the scope of this application, a "barrier thin film" 108 or an "insulator region thin film" 108 may, for example, be understood as a layer or a layer structure which is suitable for forming an insulator region against chemical contaminants or atmospheric substances, in particular against water (moisture) and oxygen. In other words, the barrier thin film 108 is configured in such a way that it cannot be penetrated, or can be penetrated at most in very small amounts, by substances that damage OLEDs, such as water, oxygen or solvents.

According to one configuration, the barrier thin film 108 may be configured as an individual layer (expressed another way, as a single layer). According to an alternative configuration, the barrier thin film 108 may include a multiplicity of sublayers arranged on top of one another. In other words, according to one configuration, the barrier thin film 108 may be configured as a layer stack. The barrier thin film 108, or one or more sublayers of the barrier thin film 108, may for example be formed by a suitable deposition method, for example by an atomic layer deposition (ALD) method according to one configuration, for example a plasma-enhanced atomic layer deposition (PEALD) method or a plasma-less atomic layer deposition (PLALD) method, or by a chemical vapor deposition (CVD) method according to another configuration, for example a plasma-enhanced vapor deposition (PECUD) method (plasma-enhanced chemical vapor deposition (PECUD)) or a plasma-less vapor deposition (PLCUD) method (plasma-less chemical vapor deposition (PLCUD)), or alternatively by other suitable deposition methods.

By using an atomic layer deposition (ALD) method, very thin layers can be deposited. In particular, layers whose layer thicknesses lie in the atomic layer range can be deposited. According to one configuration, in the case of a barrier thin film 108 which includes a plurality of sublayers, all the sublayers may be formed by an atomic layer deposition method. A layer sequence which only includes ALD layers may also be referred to as a "nanolaminate". According to an alternative configuration, in the case of a barrier thin film 108 which includes a plurality of sublayers, one or more sublayers of the barrier thin film 108 may be deposited by a deposition method other than an atomic layer deposition method, for example by a vapor deposition method. The barrier thin film 108 may, according to one configuration, have a layer thickness of from approximately 0.1 nm (one atomic layer) to approximately 1000 nm, for example a layer thickness of from approximately 10 nm to approximately 100 nm according to one configuration, for example approximately 40 nm according to one configuration.

According to one configuration, in which the barrier thin film 108 includes a plurality of sublayers, all the sublayers may have the same layer thickness. According to another configuration, the individual sublayers of the barrier thin film 108 may have different layer thicknesses. In other words, at least one of the sublayers may have a different layer thickness than one or more others of the sublayers. The barrier thin film 108, or the individual sublayers of the barrier thin film 108, may according to one configuration be configured as a translucent or transparent layer. In other words, the barrier thin film 108 (or the individual sublayers of the barrier thin film 108) may consist of a translucent or transparent material (or a material combination which is translucent or transparent).

According to one configuration, the barrier thin film 108, or (in the case of a layer stack including a multiplicity of sublayers) one or more of the sublayers of the barrier thin film 108, may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin film 108, or (in the case of a layer stack including a multiplicity of sublayers) one or more of the sublayers of the barrier thin film 108, may include one or more high-index materials, or expressed another way one or more materials having a high refractive index, for example having a refractive index of at least 2.

In one configuration, the cover 126, for example consisting of glass, may, for example, be applied by frit bonding (glass frit bonding/glass soldering/sealed glass bonding) by a conventional glass solder in the geometrical edge regions of the organic optoelectronic component 100 with the barrier thin film 108. The cover 126 may, for example, extend over all the optoelectronic components of the optoelectronic assembly.

In various embodiments, an adhesive and/or a protective coating 124 may be provided on or over the barrier thin film 108, by which, for example, a cover 126 (for example a glass cover 126) is fastened, for example adhesively bonded, on the barrier thin film 108. In various embodiments, the optically translucent layer of adhesive and/or protective coating 124 may have a layer thickness of more than 1 μm, for example a layer thickness of several μm. In various embodiments, the adhesive may include or be a lamination adhesive.

In various embodiments, light-scattering particles, which can lead to a further improvement of the hue distortion and of the output efficiency, may also be embedded in the layer of adhesive (also referred to as the adhesive layer). In various embodiments, dielectric scattering particles may, for example, be provided as light-scattering particles, for example metal oxides, for example silicon oxide ($SiO_2$), zinc oxide (ZnO), zirconium oxide ($ZrO_2$), indium tin oxide (ITO) or indium zinc oxide (IZO), gallium oxide ($Ga_2O_a$) aluminum oxide or titanium oxide. Other particles may also be suitable, so long as they have a refractive index which is different to the effective refractive index of the matrix of the translucent layer structure, for example air bubbles, acrylate, or hollow glass spheres. Furthermore, for example, metal nanoparticles, metals such as gold or silver, iron nanoparticles, or the like, may be provided as light-scattering particles.

In various embodiments, an electrically insulating layer (not represented) may also be applied between the second electrode 114 and the layer of adhesive and/or protective coating 124, for example SiN, for example with a layer thickness in a range of from approximately 300 nm to approximately 1.5 μm, for example with a layer thickness in a range of from approximately 500 nm to approximately 1 μm, in order to protect electrically unstable materials, for example during a wet chemical process.

In various embodiments, the adhesive may be configured so that it itself has a refractive index which is less than the refractive index of the cover 126. Such an adhesive may for example be a low-index adhesive, for example an acrylate, which has a refractive index of approximately 1.3. Furthermore, a plurality of different adhesives, which form an adhesive layer sequence, may be provided. Furthermore, it should be pointed out that, in various embodiments, an adhesive 124 may even be entirely omitted, for example in configurations in which the cover 126, for example consisting of glass, is applied for example by plasma spraying onto the barrier thin film 108. In various embodiments, the cover 126 and/or the adhesive 124 may have a refractive index (for example at a wavelength of 633 nm) of 1.55.

Furthermore, in various embodiments one or more anti-reflection layers (for example combined with the encapsulation 108, for example the barrier thin film 108) may additionally be provided in the light-emitting component 100.

The disclosure is not restricted to the embodiments specified. For example, more than three, for example four or five or more, optoelectronic components connected in series may be produced, in particular without carrying out a photolithographic process and/or with only one etching process.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic assembly which comprises a first optoelectronic component and at least a second optoelectronic component, which is connected in series with the first optoelectronic component, the method comprising:

forming a first electrically conductive layer on a substrate, forming a second electrically conductive layer on the first electrically conductive layer, applying an insulator material in a structured way onto the second electrically conductive layer and the substrate, in such a way that at least a first insulator region, which electrically insulates a first component region for arrangement of the first optoelectronic component from a second component region for arrangement of the second optoelectronic component, a second insulator region, which electrically insulates the second component region from a first contact region, a third insulator region, which is arranged on a side of the first component region facing away from the first insulator region, and a fourth insulator region, which is arranged between the first and second insulator regions on a side of the second component region facing away from the second insulator region, are formed by the insulator material, wherein a third contact region is formed between the first insulator region and the fourth insulator region, forming a first optically functional layer in the first component region and a second optically functional layer is formed in the second component region, and applying an electrically conductive electrode layer in a structured way onto the optically functional layers and the first and third contact regions, in such a way that the first optically functional layer is electrically coupled to the third contact region and the second optically functional layer is electrically coupled to the first contact region, wherein the second electrically conductive layer is removed in the first and second component regions before the application of the optically functional layers, and the optically functional layers are applied onto the first electrically conductive layer after the removal of the second electrically conductive layer in the first and second component regions, and wherein a protective layer is applied in a structured way onto the second electrically conductive layer after the structured application of the insulator material and before the removal of the second electrically conductive layer in the first and second component regions, in such a way that the contact regions are covered with the material of the protective layer, the protective layer protects the contact regions during the removal of the second electrically conductive layer, so that the second electrically conductive layer is preserved in the contact regions, and the protective layer is removed after the removal of the second electrically conductive layer in the first and/or second component region.

2. The method as claimed in claim 1, wherein a first trench and at least a second trench are formed in the first and second electrically conductive layers before the structured application of the insulator material, in such a way that the substrate is exposed in the first and second trenches, and wherein the first and second trenches are filled with the insulator material during the structured application of the insulator material, in such a way that the insulator material overlaps the edges of the first and second trenches, wherein the first trench at least partially bounds the first insulator region and the second trench at least partially bounds the second insulator region.

3. The method as claimed in claim 1, wherein the insulator material is heated before the application of the optically functional layers, in such a way that it is deformed and encapsulates edges and/or side surfaces of the second electrically conductive layer.

4. The method as claimed in claim 1, wherein the electrode layer comprises a first electrode section, by which the first optically functional layer is electrically coupled to the third contact region, and a second electrode section, by which the second optically functional layer is electrically coupled to the first contact region.

5. The method as claimed in claim 4, wherein a first electrode of the first optoelectronic component is formed by the second electrically conductive layer in the first contact region and the first electrically conductive layer physically coupled thereto in the first component region, and a second electrode of the first optoelectronic component is formed by the first electrode section, wherein the first optoelectronic component comprises the first organically functional layer between the first and second electrodes of the first optoelectronic component, a first electrode of the second optoelectronic component is formed by the second electrically conductive layer in the third contact region and the first electrically conductive layer physically coupled thereto in the second component region, and a second electrode of the second optoelectronic component is formed by the second electrode section, wherein the second optoelectronic component comprises the second organically functional layer between the first and second electrodes of the second optoelectronic component, and the first optoelectronic component and the second optoelectronic component are connected in series by the physical contact of the second electrode of the first optoelectronic component with the first electrode of the second optoelectronic component.

6. The method as claimed in claim 1, wherein the insulator material is applied in a structured way onto the second layer and the substrate, in such a way that at least a fifth insulator region, which electrically insulates a third component region for formation of a third optoelectronic component from the first contact region, and a sixth insulator region, which is arranged on a side of the third component region facing away from the fifth insulator region, are formed by the insulator material, wherein a fourth contact region is formed between the sixth insulator region and the second insulator region, and wherein the second insulator region electrically insulates the second component region from the third component region, a third optically functional layer is formed in the third component region, the electrode layer is applied in a structured way onto the optically functional layers and the fourth contact region, in such a way that the third optically functional layer is electrically coupled to the first contact region and the second optically functional layer is electrically coupled to the fourth contact region.

7. The method as claimed in claim 2, wherein at least one of the trenches is formed by laser ablation.

8. The method as claimed in claim 1, wherein the insulator material is applied by a printing method.

9. The method as claimed claim 1, wherein the protective layer is applied by a printing method.

10. The method as claimed in claim 1, wherein the insulator material is acid-soluble or base-soluble.

11. The method as claimed in claim 10, wherein the material of the protective layer is base-soluble and the insulator material is acid-soluble, or wherein the material of the protective layer is acid-soluble and the insulator material is base-soluble.

* * * * *